(12) United States Patent
Van Gorp et al.

(10) Patent No.: US 10,409,273 B2
(45) Date of Patent: Sep. 10, 2019

(54) MONITORING LOAD OPERATION

(71) Applicant: SCHNEIDER ELECTRIC USA, INC., Palatine, IL (US)

(72) Inventors: John C. Van Gorp, Sidney (CA); Shawn Edward Balding, Victoria (CA); Jacques Roland van Campen, Saanichton (CA)

(73) Assignee: SCHNEIDER ELECTRIC USA, INC., Andover, MA (US)

(*) Notice: Subject to any disclaimer, the term of this patent is extended or adjusted under 35 U.S.C. 154(b) by 266 days.

(21) Appl. No.: 14/761,093

(22) PCT Filed: Jan. 16, 2013

(86) PCT No.: PCT/US2013/021656
§ 371 (c)(1),
(2) Date: Jul. 15, 2015

(87) PCT Pub. No.: WO2014/112987
PCT Pub. Date: Jul. 24, 2014

(65) Prior Publication Data
US 2015/0355635 A1      Dec. 10, 2015

(51) Int. Cl.
*G05B 23/02*   (2006.01)
*G01R 21/133*  (2006.01)
(Continued)

(52) U.S. Cl.
CPC ..... *G05B 23/0221* (2013.01); *G01R 19/2513* (2013.01); *G01R 21/1331* (2013.01);
(Continued)

(58) Field of Classification Search
CPC ........... G05B 23/0221; G01R 19/2513; G01R 21/1331; G01R 21/133; H02J 13/14; H02J 2003/143
(Continued)

(56) References Cited

U.S. PATENT DOCUMENTS 5,684,710 A   11/1997   Ehlers et al.
8,255,090 B2   8/2012   Frader-Thompson et al.
(Continued)

FOREIGN PATENT DOCUMENTS

WO   2011151622 A2   12/2011
WO   2012040079 A2   3/2012

OTHER PUBLICATIONS

International Search Report and Written Opinion from corresponding PCT Application Serial No. PCT/US2013/021656, dated Mar. 22, 2013.
(Continued)

*Primary Examiner* — Mohammad Ali
*Assistant Examiner* — Joshua T Sanders
(74) *Attorney, Agent, or Firm* — Lando & Anastasi, LLP

(57) ABSTRACT

A method of monitoring power usage of a load includes defining one or more parameters of the load that vary with a mode of operation of the load, receiving measurement data related to the one or more parameters of the load over a first period of time, recording the measurement data, determining a plurality of groups, each group defining a set of measurements in a continuous range of values, each group having a lower threshold value and an upper threshold value, the lower and upper threshold values defined by having less than a minimum threshold number of recorded measurements of the lower and upper threshold values, and associating a mode of operation with each of the plurality of groups.

20 Claims, 6 Drawing Sheets

(51) Int. Cl.
*H02J 3/14* (2006.01)
*G01R 19/25* (2006.01)

(52) U.S. Cl.
CPC ............. *H02J 3/14* (2013.01); *G01R 21/133* (2013.01); *H02J 2003/143* (2013.01); *Y04S 20/38* (2013.01)

(58) Field of Classification Search
USPC ........................................................ 700/296
See application file for complete search history.

(56) References Cited

U.S. PATENT DOCUMENTS

| | | |
|---|---|---|
| 2007/0124094 A1 | 5/2007 | Brey et al. |
| 2011/0181268 A1 | 7/2011 | Shuey |
| 2012/0004871 A1* | 1/2012 | Tsao ................... G01R 19/2513 702/61 |
| 2012/0158201 A1 | 6/2012 | Leeds |
| 2012/0221150 A1* | 8/2012 | Arensmeier ....... G05B 23/0224 700/276 |
| 2012/0296486 A1* | 11/2012 | Marriam ................ G05B 15/02 700/296 |

OTHER PUBLICATIONS

Extended European Search Report from corresponding European Application No. 13871636.0 dated Nov. 21, 2016.

* cited by examiner

MONITORING LOAD OPERATION

RELATED APPLICATION

This application is a U.S. National Stage Application under 35 U.S.C. § 371 of International Application No. PCT/US2013/021656, filed Jan. 16, 2013, which is hereby incorporated herein by reference in its entirety.

BACKGROUND

Field of Invention

At least some embodiments of the present invention relate to systems and methods for monitoring loads.

Discussion of Related Art

Facilities often rely on electricity to operate numerous systems. Facilities can draw the electricity from an electric utility, but also have a generator to use as a backup in case of power failure or other problems. It is often useful to have information about the power drawn by loads at the facility.

SUMMARY

At least one aspect of the disclosure is directed to a method of monitoring power usage of a load. The method may include defining one or more parameters of the load that vary with a mode of operation of the load, receiving measurement data related to the one or more parameters of the load over a first period of time, recording the measurement data, determining a plurality of groups, each group defining a set of measurements in a continuous range of values, each group having a lower threshold value and an upper threshold value, the lower and upper threshold values defined by having less than a minimum threshold number of recorded measurements of the lower and upper threshold values, and associating a mode of operation with each of the plurality of groups.

In some embodiments, the method further includes receiving additional measurement data after the first period of time, determining a group of the plurality of groups in which the additional measurement data belongs, and based on the determining of the group, generating an indication of the mode of operation of the load.

In some embodiments, the method further includes storing the mode of operation of the load over a second time period.

In some embodiments, the method further includes determining a maintenance schedule based on the stored mode of operation information. In some embodiments, the method further includes determining, based on the stored modes of operation, a duty cycle of the load. In some embodiments, the method further includes determining, based on the stored modes of operation, a time of actual operation of the load.

In some embodiments, generating an indication of the mode of operation of the load includes generating the indication on a monitor. In some embodiments, the method further includes providing the indication to a server. In some embodiments, the method further includes providing the indication to a mobile device.

Some aspects of the disclosure are directed to a load monitoring system for a facility, including one or more monitors configured to monitor one or more parameters of a load in the facility and a processor configured to be coupled to the one or more monitors. The processor is configured to receive measurement data related to the one or more parameters of the load over a first period of time, record the measurement data, determine a plurality of groups, each group defining a set of measurements in a continuous range of values, each group having a lower threshold value and an upper threshold value, the lower and upper threshold values defined by having less than a minimum threshold number of recorded measurements of the lower and upper threshold values, and associate a mode of operation with each of the plurality of groups.

Some aspects of the disclosure are directed to a non-transitory computer readable medium having stored thereon sequences of instruction for predicting available run time for a generator including instructions that will cause at least one processor to receive measurement data of the one or more parameters of the load over a first period of time, record the measurement data, determine a plurality of groups, each group defining a set of measurements in a continuous range of values, each group having a lower threshold value and an upper threshold value, the lower and upper threshold values defined by having less than a minimum threshold number of recorded measurements of the lower and upper threshold values, and associate a mode of operation with each of the plurality of groups.

Still other aspects, examples and advantages of these exemplary aspects and examples, are discussed in detail below. Moreover, it is to be understood that both the foregoing information and the following detailed description are merely illustrative examples of various aspects and examples, and are intended to provide an overview or framework for understanding the nature and character of the claimed aspects and examples. Any example disclosed herein may be combined with any other example. References to "an example," "some examples," "an alternate example," "various examples," "one example," "at least one example," "this and other examples" or the like are not necessarily mutually exclusive and are intended to indicate that a particular feature, structure, or characteristic described in connection with the example may be included in at least one example. The appearances of such terms herein are not necessarily all referring to the same example.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

A load monitoring system can provide more accurate information of a load's operation. Specifically, a parameter of a load can be monitored for a baseline period of time. The measurements of the parameter can be grouped based on the measurements values. The groups can be indicative of modes of operation of the load. Measurements received after the baseline period of time can be output and stored as the corresponding mode of operation. Mode of operation information can be used in a variety of ways, including more efficiently scheduling maintenance of the load.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, components, elements or acts of the systems and methods herein referred to in the singular may also embrace examples including a plurality, and any references in plural to any example, component, element or act herein may also embrace examples including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
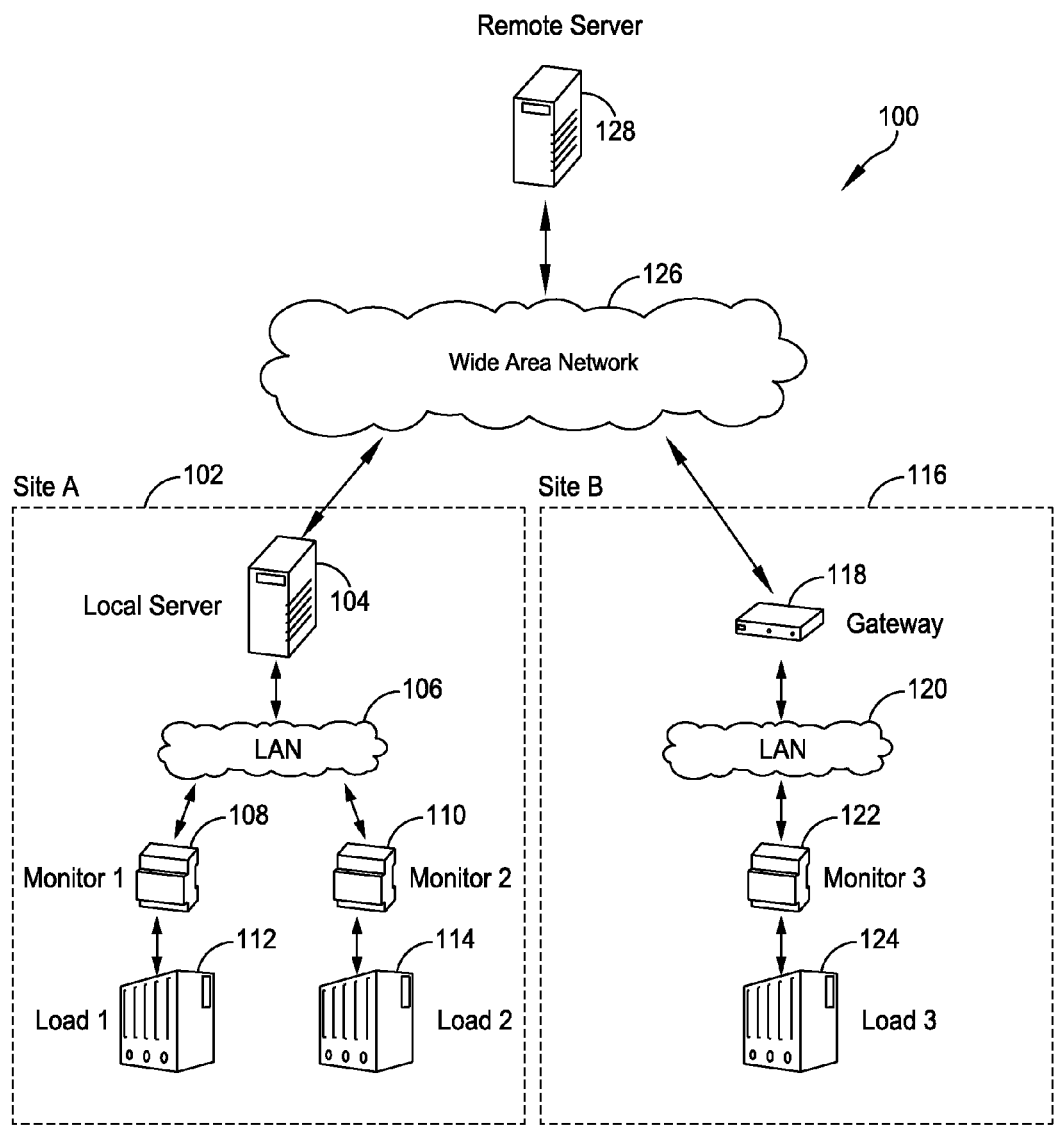
FIG. 1 is a block diagram of a load monitoring system according to aspects of some embodiments.

FIG. 1 shows an example block diagram of a load monitoring system 100 according to some embodiments. The load monitoring system 100 includes a first site 102 with a local server 104 connected to a network, such as a local area network (LAN) 106. The first site 102 also includes a first load 112 and a second load 114 monitored by a first monitor 108 and a second monitor 110, respectively. The first and second monitors 108, 110 are also connected to the LAN 106 and can communicate with the local server 104. The monitors 108, 110 monitor one or more parameters of the loads 112, 114 and transmit data to the local server 104 via the LAN 106. In some embodiments, the monitors 108, 110 comprise one or more processors and one or more sensors configured to measure one or more parameters of the loads 112, 114.

The load monitoring system 100 also includes a second site 116 with a communication gateway 118 connected to a network, such as a LAN 120. The second site 116 also includes a third load 124 monitored by a third monitor 122. The third monitor 122 is connected to the LAN 120 and can communicate with the communication gateway 118. The monitor 122 monitors one or more parameters of the load 124 and transmits data to the gateway 118 via the LAN 120.

The load monitoring system 100 also includes a remote server 128 connected to a network, such as a wide area network (WAN) 126. The local server 104 of the first site 102 is also connected to the WAN 126 and can communicate with the remote server 128. The communication gateway 118 of the second site 116 is also connected to the WAN 126 and can also communicate with the remote server 128. The remote server 128 receives data from the local server 104 and the communication gateway 118 relating to the one or more parameters of the loads 112, 114, 124.

The parameters that are monitored include measurable quantitative characteristics associated with the load. For example, parameters can include voltage, current, instantaneous power drawn, energy, power factor, ambient temperature, and other appropriate characteristics. Parameters can also include environmental parameters, such as time of day, time of year, and outdoor temperature.

The loads include devices and systems that use power. The loads that are monitored can comprise one device or a plurality of devices. For example, the load can be a building and the power drawn by all the devices and systems in the building, including heating, air conditioning, and ventilation (HVAC), electricity used by lights, computers, and other devices. The load can also be monitored on more granular levels, such as a monitor for the HVAC system and a monitor for the lighting system. Multiple monitors can be used on multiple levels.

For example, the first site 102 can be a building, and the first load 112 can be a main electrical service to the building. The first monitor 108 can monitor one or more parameters, such as power in kilowatts (kW). The first monitor 108 can measure power values at various times. The measurements can be taken periodically, such as once a minute, once an hour, once every several minutes, several times a minute, or any other period of time. The measurements can also be taken at a user's request. The measurements can also be taken based on changes detected in the parameters. The periodicity of the measuring can change, for example, based on environmental parameters. For example, fewer measurements can be taken at night. The measurements can also be taken aperiodically.

Figure 2A:
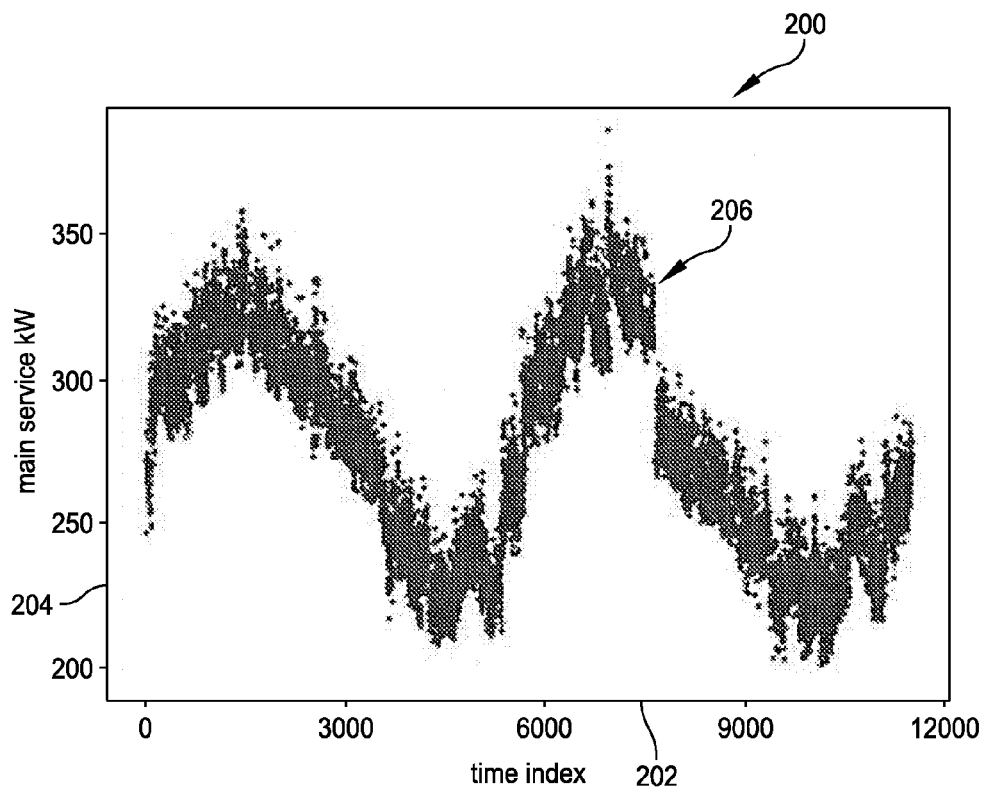
FIG. 2A illustrates an example load profile according to aspects of some embodiments.
Figure 2B:
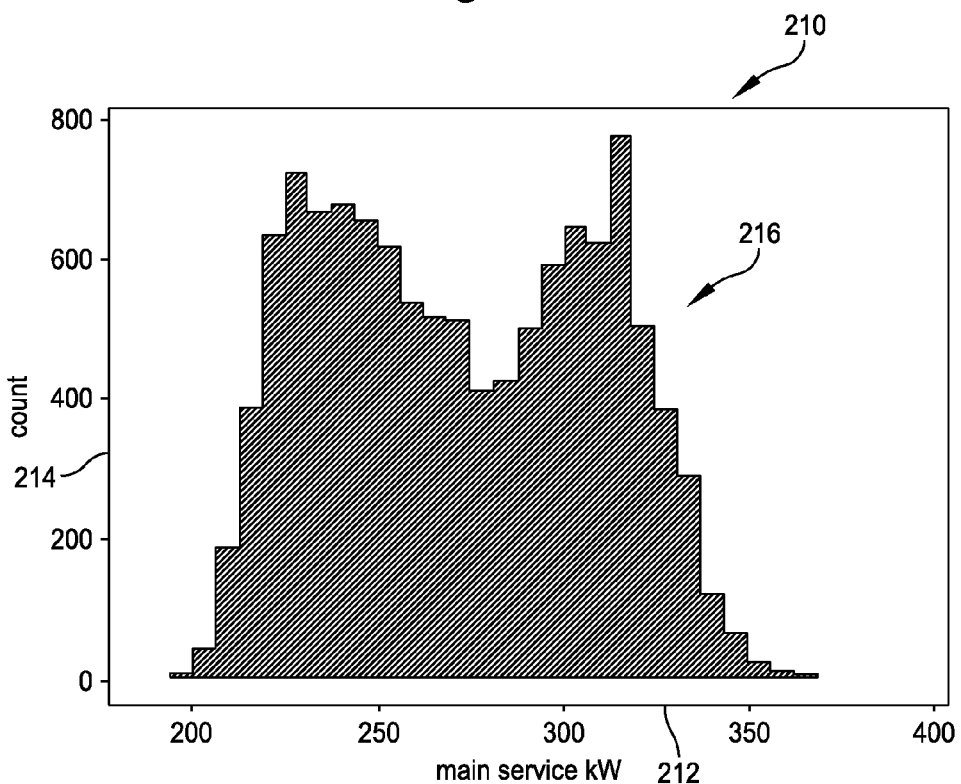
FIG. 2B illustrates an example load profile according to aspects of some embodiments.

The first monitor 108 can transmit the measurements to the local server 104. The local server 104 can transmit the measurements to the remote server 128. The remote server 128 can record the measurements received from the first monitor 108 via the local server 104. The remote server 128 can analyze the measurement data. For example, FIGS. 2A and 2B show example profiles 200, 210 of power measurement values of the main electrical service to the building. The x-axis of the profile 200 of FIG. 2A shows a time index 202, showing measurements over a period of about two days. The y-axis is the power 204 in kW. The measurement values 206 are plotted based on the measured power 204 at each time 202. FIG. 2B shows the same measurements grouped as a histogram 216 of measured values. The x-axis shows the kW measurements 212 and the y-axis is a count 214 of the number of times the measurement value was recorded.

In this example, as the monitor measured power consumed at the main electrical service, the power profiles 200, 210 represent the operation of all the individual loads in the building. The individual loads operate at different power levels and different times. The aggregation of the loads results in measurements at the main service level that are a relatively continuous range of power measurement values 206. The power profile 200 has a sinusoidal shape, with peak values occurring during the day and lowest values occurring during the night. The histogram 216 reflects the bimodal behavior and also highlights the continuous range of power measurement values between the peak and lowest values.

With monitors used at a more granular level, more information can be extracted from monitoring loads. For example, monitors can be placed on individual loads. Some individual loads may draw power over a continuous range of values and result in power profiles with similar shapes as the power profiles 200, 210 of FIGS. 2A and 2B, though at a different scale.

Some individual loads may run in a fixed number of modes of operation, and draw power in discrete ranges of values. Loads can also consist of several component loads that switch on and off in different combinations. Each combination can be a mode of operation.

Figure 3A:
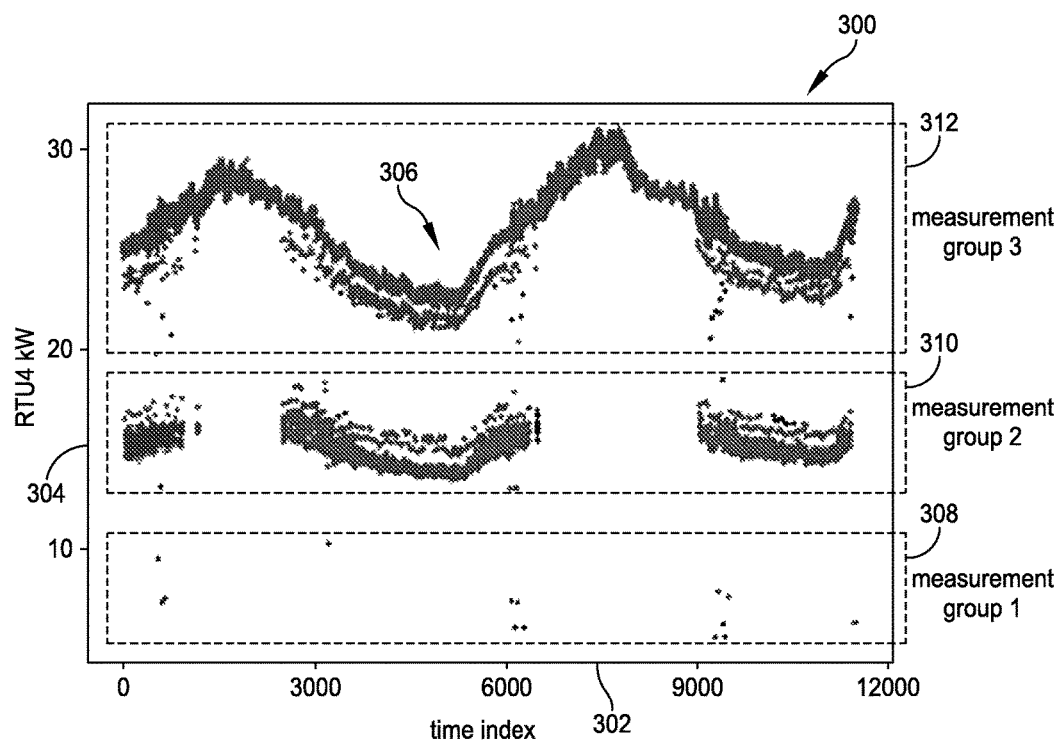
FIG. 3A illustrates an example load profile according to aspects of some embodiments.
Figure 3B:
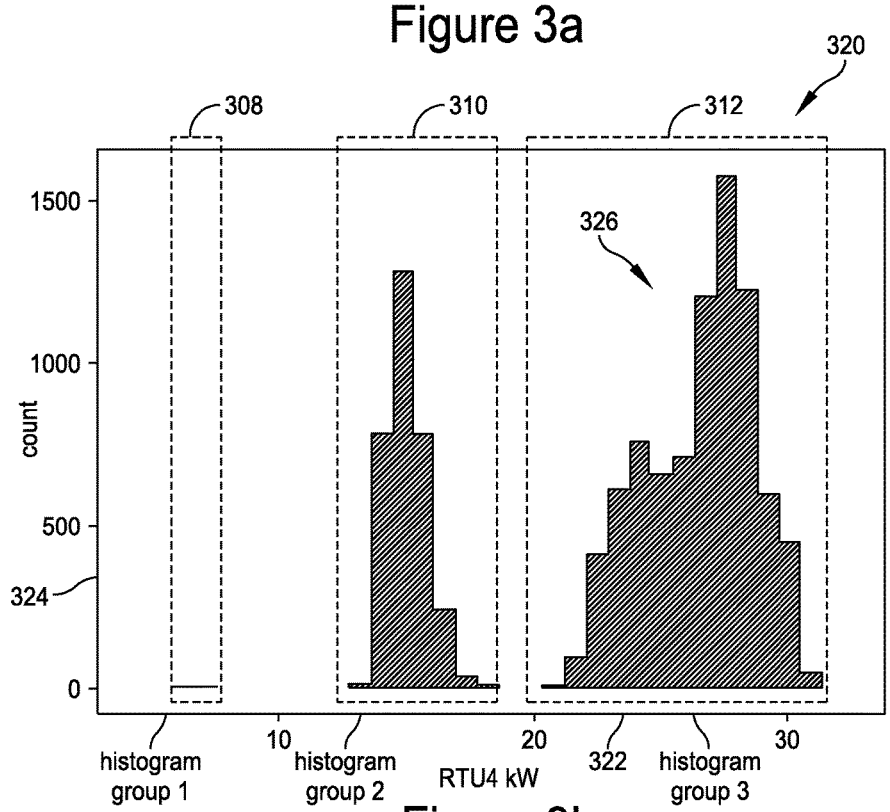
FIG. 3B illustrates an example load profile according to aspects of some embodiments.

For example, a load can be a rooftop unit air conditioner that is monitored for power consumption. FIGS. 3A and 3B show example profiles 300, 320 of power measurement values of the air conditioner. Similar to the power profiles of FIGS. 2A and 2B, the x-axis of the profile 300 of FIG. 3A shows a time index 302, showing measurements over a period of about two days. The y-axis is the power 304 in kW. The measurement values 306 are plotted based on the measured power 304 at each time 302. FIG. 3B shows the same measurements grouped as a histogram 326 of measured values. The x-axis shows the kW measurements 322 and the y-axis is a count 324 of the number of times the measurement value was recorded.

In this example, the power profiles 300, 320 reflect that the load runs in a fixed number of modes of operation. Each mode of operation can have a range of power measurement values. Thus, the measurement values 306 can be grouped based on the ranges of power. In some embodiments, the groups are defined by a set of measurements in a continuous range of values, with each group having a lower threshold value and an upper threshold value. The lower and upper threshold values are determined as the measurement values where there are fewer than a minimum threshold number of measurements. For example, the power profiles 300, 320 of FIG. 3 can be divided into three groups. The histogram 326 shows clearly the gaps between the groups having zero (or less than a minimum threshold) counts of the measurement values being recorded. Each of the three groups 308, 310, 312 has a continuous range of measurement values recorded. Each of the groups 308, 310, 312 can be associated with a mode of operation of the load.

For example, the first group 308 can be associated as a standby mode or an off mode. In some embodiments, a load may constantly draw a low amount of power in a standby mode of operation. The load may draw no power in an off mode. In some embodiments, the first group 308 can be below a minimum threshold of values, and the power profiles 300, 320 can be divided into two groups. In some embodiments, the gaps in measurement values found in the first group 308 can result in further division of the first group.

The second group 310 contains a range of measured values from about 13 kW to about 18 kW. In some embodiments, the air conditioner includes a fan motor and a compressor motor. In a fan mode of operation, the fan motor in the air conditioner runs while the compressor motor does not run. The fan mode of operation can draw power in the range of values reflected in the second group 310. Thus, the second group 310 can be associated with the fan mode of operation.

The third group 312 contains a range of measured values from about 21 kW to about 31 kW. In some embodiments, a compressor mode of operation runs both the fan motor and the compressor motor in the air conditioner. The compressor mode of operation can draw power in the range of values reflected in the third group 312. Thus, the third group 312 can be associated with the compressor mode of operation.

Figure 4A:
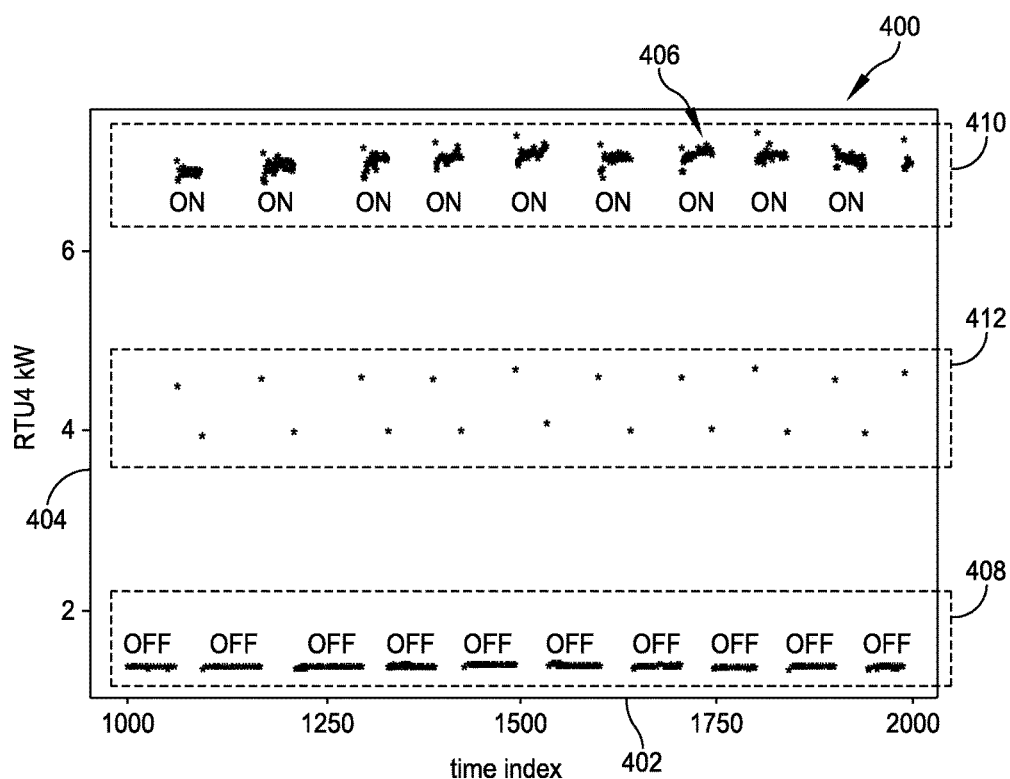
FIG. 4A illustrates an example load profile according to aspects of some embodiments.
Figure 4B:
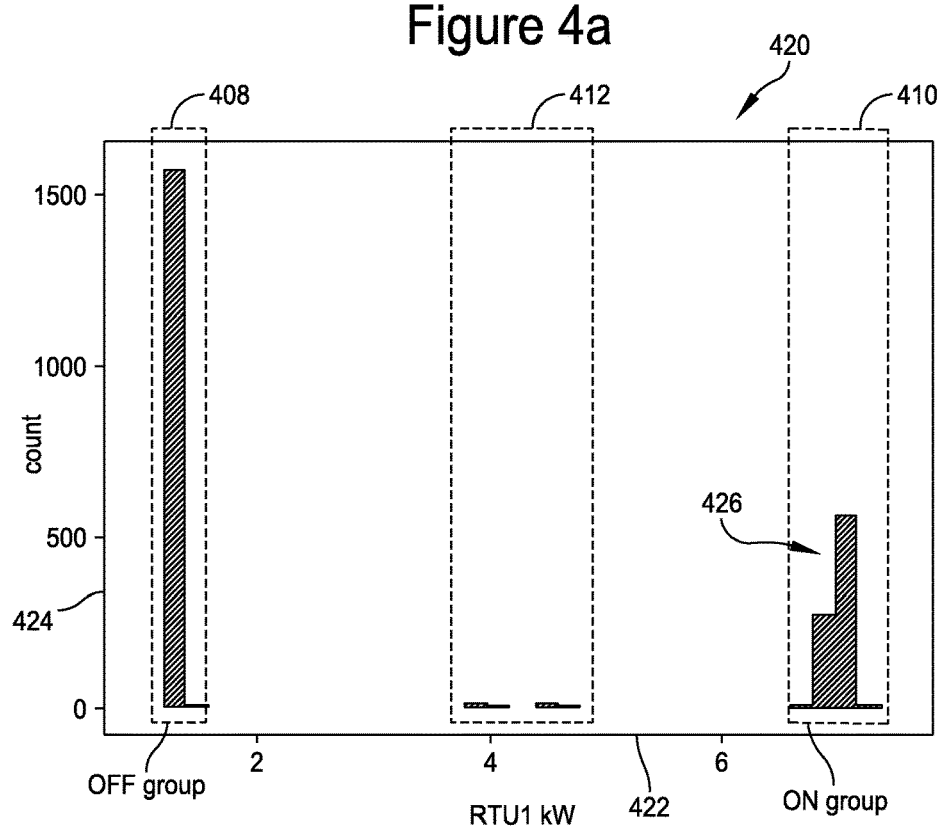
FIG. 4B illustrates an example load profile according to aspects of some embodiments.

FIGS. 4A and 4B show another example power profile 400, 420. Similar to FIGS. 2 and 3, the x-axis of the profile 400 of FIG. 4A shows a time index 402, showing measurements over a period of time. The y-axis is the power 404 in kW. The measurement values 406 are plotted based on the measured power 404 at each time 402. FIG. 4B shows the same measurements grouped as a histogram 426 of measured values. The x-axis shows the kW measurements 422 and the y-axis is a count 424 of the number of times the measurement value was recorded.

A first group 408 contains a range of measured values from about 0 kW to about 1 kW. The first group 408 can be associated with an off mode of operation. A second group 410 contains a range of measured values from about 6 kW to about 8 kW. The second group 410 can be associated with an on mode of operation. A third group 412 has sporadic numbers of measured values from about 3 kW to about 5 kW. As described above, in some embodiments, a minimum threshold of measurements can be set. The third group 412 can be determined to be below the minimum threshold. The third group 412 can be indicative of measurements taken as the load transitioned from the off mode to the on mode or from the on mode to the off mode. Thus, a minimum threshold can be effected to avoid false positive determinations of modes of operation.

Figure 5:
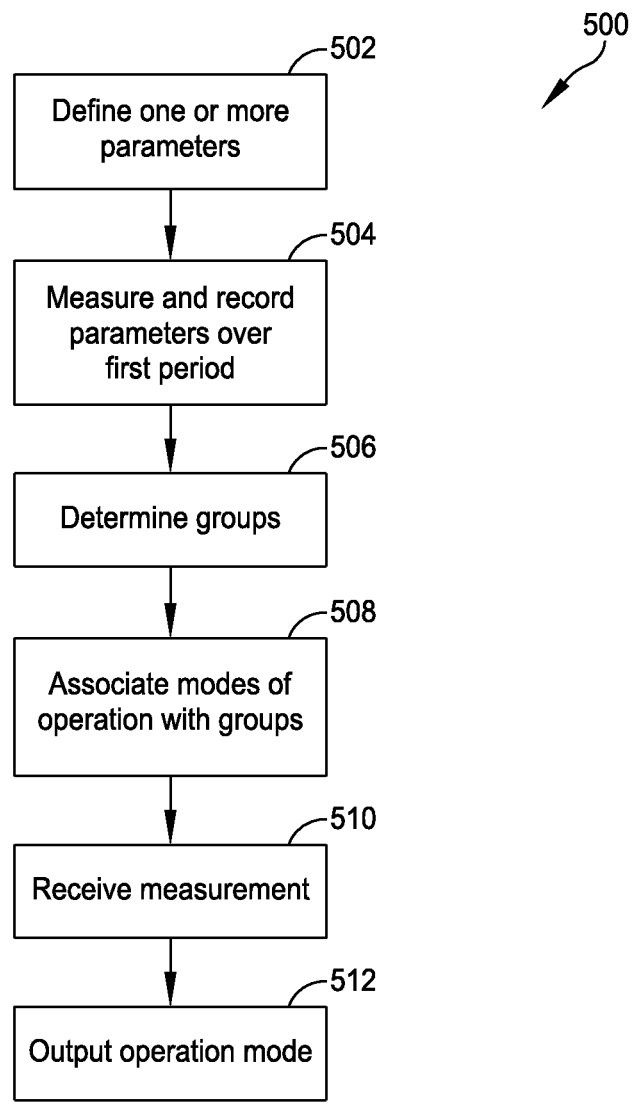
FIG. 5 illustrates a process flowchart of a load monitor system according to aspects of some embodiments.

FIG. 5 shows an example process 500 executed by the load monitoring system. The process 500 can be executed, for example, by the remote server 128 and/or the local server 104. Different acts can be executed by different computers and processors in the system. At act 502, one or more parameters are defined. The parameters can include measurable characteristics of the load. While the above examples used power in kilowatts, other characteristics can be used. The parameters can include voltage, current, power factor, and other characteristics. Parameters can also include environmental parameters such as time and temperature. Multiple parameters can be used to generate multiple histograms, or multiple parameters can be aggregated into a single histogram for analysis. Groups can be defined across multiple parameters. In some embodiments, a primary parameter can be used for grouping and other parameters can be used as secondary parameters to refine groups, such as combining one or more groups or further dividing one or more groups. Secondary parameters can also be used to calibrate primary parameters for grouping. For example, a primary parameter can be power for an air conditioning system. Outdoor temperature can be used as a secondary parameter. The air conditioning system can be measured using more power depending on the outdoor temperature. On hot days, the air conditioning system might draw more power across all modes of operation and the groupings can be shifted to reflect the effect of the secondary parameters.

At act 504, the one or more parameters are measured and recorded for a baseline period of time. In some embodiments, the baseline period of time is long enough to capture a statistically significant number of measurement values in each operating mode of the load. The baseline period of time can be a year or longer, for example, if seasonal changes affect the operating modes of the load. In some embodiments, the length of time needed to generate a baseline might not be known. The baseline period of time can be set to a default value and prolonged if new measurement values are being received. For example, a default baseline period of time can be one week. After the week, the system can monitor the parameters and check each day whether measurement values have been recorded for which values had not be recorded previously. If so, the baseline period of time can be prolonged another day. If not, the baseline period of time can end. Additionally or alternatively, the system can periodically recalibrate and the parameters can be measured and recorded for another baseline period to determine if previously unmeasured operating modes are detected.

The one or more parameters also are measured frequently enough to capture changes in the parameter. For example, some loads can change the amount of power drawn every minute. The system can have a default measurement frequency, such as once a second, which can be lengthened during the first period of time if no changes are detected or it is determined that the load changes less frequently than being measured. The measurements can be recorded by a computer, for example, to memory or a disk.

At act 506, groups are determined based on the recorded measurement values. In some embodiments, the groups are defines as described above, with upper and lower threshold values where the number of measurements do not meet a minimum threshold. Other types of data mining and analysis can be conducted on the measurements to determine groups. As described above, a minimum threshold number of measurements can be set for a number of recorded measurements to be considered a group. The threshold can be an absolute value, such as 10, or the threshold can be a relative value comparing the count of measurement values with counts of other measurement values. For example, the threshold can be a threshold percentage of total counts. Relative thresholds can also be used to determine the upper and lower threshold values of each group.

At act 508, modes of operation are associated with each of the groups. In the examples above, the modes of operation corresponded to known operation modes of the load, such as fan mode and compressor mode. Where such information is available, the known operation modes can be associated with the groups. Other known information about the load and expected characteristics of the load can be used in determining groups. In some embodiments, the operation modes are given generic labels and associated with the groups.

At act 510, a measurement is received at a second period of time, which is after the first period of time. The system compares the measurement received with the measurements recorded during the first period of time and determines to which group the received measurement belongs. At act 512, the system outputs the corresponding operation mode. Thus, as the system monitors the load after the first period of time, the system can determine in which operation mode the load is operating. For example, as the system monitors the load and receives measurements, the system can display to a user that the air conditioner is in fan mode or compressor mode or in standby mode.

In some embodiments, if the measurement received is not in any of the associated groups, the measurement can be ignored. In some embodiments, if a threshold number of measurements that are not in associated groups is received, the system can recalibrate the baseline and monitor the parameters for another baseline period. When recalibrating, the existing groups can be kept and any new groups can be added as additional modes of operations. Alternatively, the existing groups can be erased and an entirely new baseline set of groups can be established.

The mode of operation can also be tracked over time to detect patterns of load operation. The mode of operation information can be used to determine time spent in each operating mode by the load. Such information can also be analyzed and broken down in different units of time.

The mode of operation information can also be used to compare times spent in operating modes. For example, for a load with an on mode and an off mode, if the load spends 40% of the time in on mode and 60% in off mode, the load can be determined to have a 40% duty cycle. Algorithms can be used to determine duty cycles of loads with more modes of operation, depending on the power usage of each mode of operation.

The mode of operation information can be used to allow better scheduling of maintenance. More accurate duty cycle information can allow for more accurate determining of when a load needs maintenance. For example, providing maintenance to a load after a certain number of hours of actual use can be more efficient than providing maintenance after a certain number of hours of deployment. Further, the mode of operation information can provide a better time for providing the maintenance, such as when the past use indicates a likely period of low level mode of operation.

While the example load monitoring system 100 of FIG. 1 shows a first and second site, the load monitoring system 100 can include one site or more than two sites. The sites can include one or more servers and/or one or more communication gateways. In some embodiments, the remote server is located at a site. The local server and the remote server can be implemented on the same server or server system. The monitors can communicate with the servers and gateways through LANs, WANs, the Internet, or any other network. The monitors can also communicate directly with the servers and/or gateways, for example, through a serial connection. The servers and gateways can communicate via the WAN or through LANs, the Internet, or any other network. In some embodiments, the monitors communicate directly to the remote server.

In some embodiments, the monitors execute the process 500 and communicate the output mode of operation to the local server or the remote server. In some embodiments, the monitors store the information and a user can download the information from the monitors directly, such as through a mobile device. The user can then upload the information to a server for archival and further data processing. In some embodiments, the remote server can be a component of a service offered to the user, with the service including retrieval of stored mode of operation information, comparisons of operation between the user's load and similar loads monitored by the remote server, and other services.

Various aspects and functions described herein may be implemented as specialized hardware or software components executing in one or more computer systems. There are many examples of computer systems that are currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Consequently, examples are not limited to executing on any particular system or group of systems. Further, aspects and functions may be implemented in software, hardware or firmware, or any combination thereof. Thus, aspects and functions may be implemented within methods, acts, systems, system elements and components using a variety of hardware and software configurations, and examples are not limited to any particular distributed architecture, network, or communication protocol.

Figure 6:
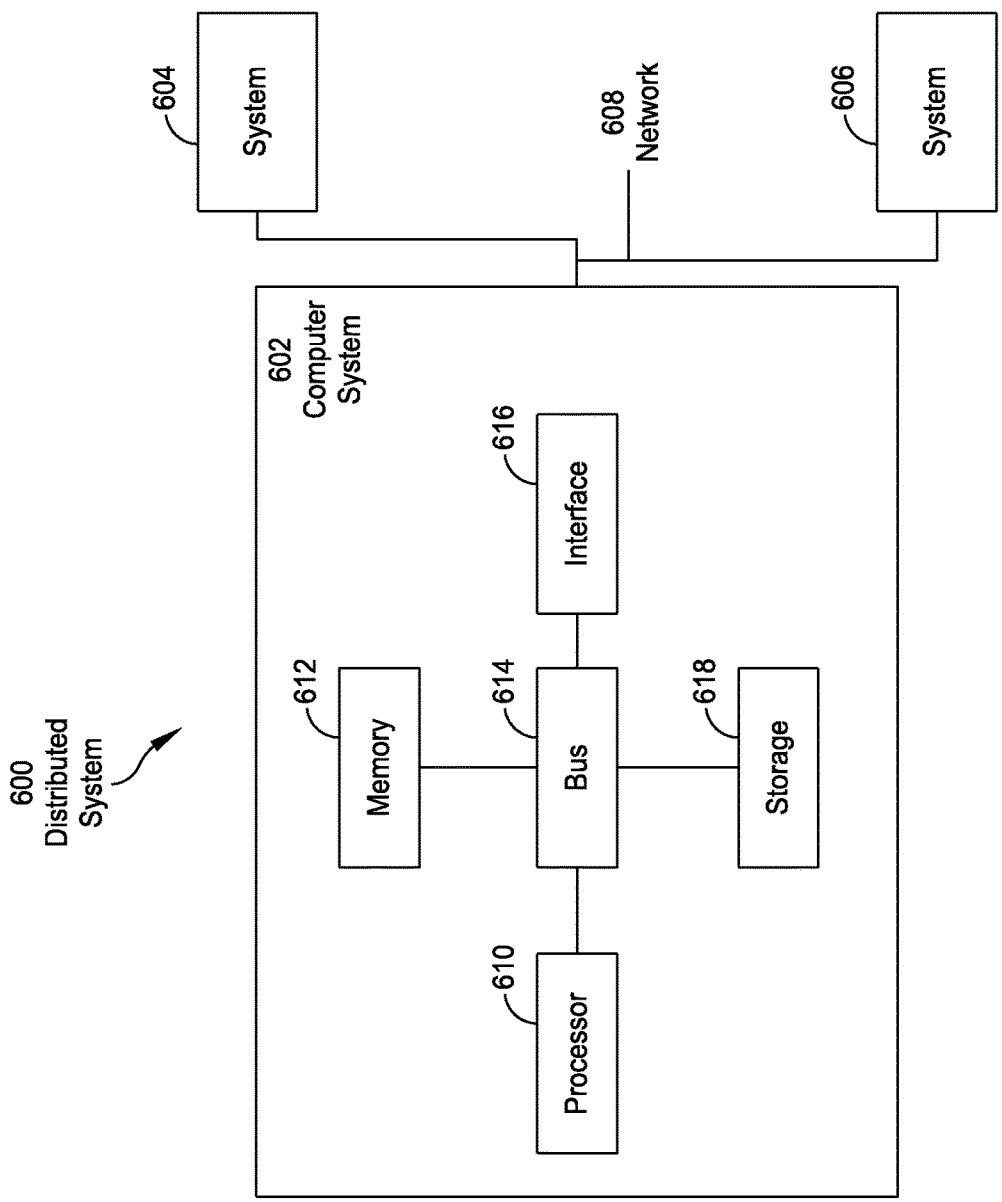
FIG. 6 is a schematic diagram of one example of a computer system that may perform processes and functions disclosed herein.

Referring to FIG. 6, there is illustrated a block diagram of a distributed computer system 600, in which various aspects and functions are practiced. As shown, the distributed computer system 600 includes one more computer systems that exchange information. More specifically, the distributed computer system 600 includes computer systems 602, 604 and 606. As shown, the computer systems 602, 604 and 606 are interconnected by, and may exchange data through, a communication network 608. The network 608 may include any communication network through which computer systems may exchange data. To exchange data using the network 608, the computer systems 602, 604 and 606 and the network 608 may use various methods, protocols and standards, including, among others, Fibre Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST and Web Services. To ensure data transfer is secure, the computer systems 602, 604 and 606 may transmit data via the network 608 using a variety of security measures including, for example, TLS, SSL or VPN. While the distributed computer system 600 illustrates three networked computer systems, the distributed computer system 600 is not so limited and may include any number of computer systems and computing devices, networked using any medium and communication protocol.

As illustrated in FIG. 6, the computer system 602 includes a processor 610, a memory 612, a bus 614, an interface 616 and data storage 618. To implement at least some of the aspects, functions and processes disclosed herein, the processor 610 performs a series of instructions that result in manipulated data. The processor 610 may be any type of processor, multiprocessor or controller. Some exemplary processors include commercially available processors such as an Intel Xeon, Itanium, Core, Celeron, or Pentium processor, an AMD Opteron processor, a Sun UltraSPARC or IBM Power5+ processor and an IBM mainframe chip. The processor 610 is connected to other system components, including one or more memory devices 612, by the bus 614.

The memory 612 stores programs and data during operation of the computer system 602. Thus, the memory 612 may be a relatively high performance, volatile, random access memory such as a dynamic random access memory (DRAM) or static memory (SRAM). However, the memory 612 may include any device for storing data, such as a disk drive or other non-volatile storage device. Various examples may organize the memory 612 into particularized and, in some cases, unique structures to perform the functions disclosed herein. These data structures may be sized and organized to store values for particular data and types of data.

Components of the computer system 602 are coupled by an interconnection element such as the bus 614. The bus 614 may include one or more physical busses, for example, busses between components that are integrated within a same machine, but may include any communication coupling between system elements including specialized or standard computing bus technologies such as IDE, SCSI, PCI and InfiniBand. The bus 614 enables communications, such as data and instructions, to be exchanged between system components of the computer system 602.

The computer system 602 also includes one or more interface devices 616 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 602 to exchange information and to communicate with external entities, such as users and other systems.

The data storage 618 includes a computer readable and writeable nonvolatile, or non-transitory, data storage medium in which instructions are stored that define a program or other object that is executed by the processor 610. The data storage 618 also may include information that is recorded, on or in, the medium, and that is processed by the processor 610 during execution of the program. More specifically, the information may be stored in one or more data structures specifically configured to conserve storage space or increase data exchange performance. The instructions may be persistently stored as encoded signals, and the instructions may cause the processor 610 to perform any of the functions described herein. The medium may, for example, be optical disk, magnetic disk or flash memory, among others. In operation, the processor 610 or some other controller causes data to be read from the nonvolatile recording medium into another memory, such as the memory 612, that allows for faster access to the information by the processor 610 than does the storage medium included in the data storage 618. The memory may be located in the data storage 618 or in the memory 612, however, the processor 610 manipulates the data within the memory, and then copies the data to the storage medium associated with the data storage 618 after processing is completed. A variety of components may manage data movement between the storage medium and other memory elements and examples are not limited to particular data management components. Further, examples are not limited to a particular memory system or data storage system.

Although the computer system 602 is shown by way of example as one type of computer system upon which various aspects and functions may be practiced, aspects and functions are not limited to being implemented on the computer system 602 as shown in FIG. 6. Various aspects and functions may be practiced on one or more computers having a different architectures or components than that shown in FIG. 6. For instance, the computer system 602 may include specially programmed, special-purpose hardware, such as an application-specific integrated circuit (ASIC) tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 602 may be a computer system including an operating system that manages at least a portion of the hardware elements included in the computer system 602. In some examples, a processor or controller, such as the processor 610, executes an operating system. Examples of a particular operating system that may be executed include a Windows-based operating system, such as, Windows NT, Windows 2000 (Windows ME), Windows XP, Windows Vista or Windows 7 operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular operating system.

The processor 610 and operating system together define a computer platform for which application programs in high-level programming languages are written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements, e.g. specialized hardware, executable code, data structures or objects, that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters, such as sponsor types and sectors, and thereby configure the behavior of the components.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of monitoring power usage of a plurality of loads using a load monitoring system, the load monitoring system including a plurality of load monitors, each of the plurality of load monitors coupled to a respective load of the plurality of loads, the method comprising:
defining one or more parameters of the plurality of loads that vary with a mode of operation of the loads;
receiving measurement data related to the one or more parameters of the plurality of loads over a first, baseline period of time at respective inputs of the plurality of load monitors;
recording the measurement data;
determining a plurality of groups indicative of a plurality of modes of operation of the plurality of loads based on the measurement data, each group defining a set of measurements in a continuous range of values, each group having a lower threshold value and an upper threshold value, the lower and upper threshold values defined by having fewer than a minimum threshold number of recorded measurements of the lower and upper threshold values;
storing the plurality of modes of operation of the plurality of loads;
receiving additional measurement data after the first, baseline period of time;
determining if the additional measurement data fits into any of the plurality of groups;
in response to determining at least some of the additional measurement data does not fit into any of the plurality of groups, generating a count value indicative of a number of the additional measurement data not fitting into any of the plurality of groups;
in response to the count value exceeding a threshold, receiving measurement data related to the one or more parameters of the plurality of loads over a new, baseline period of time, and recalibrating the plurality of groups and the stored plurality of modes of operation based on the measurement data received over the new, baseline period of time;
determining a maintenance schedule for each load of the plurality of loads based on the stored plurality of modes of operation and a detected pattern of operation of each of the plurality of loads; and
scheduling maintenance of each of the plurality of loads based on the determined maintenance schedule.

2. The method of claim 1, further comprising:
in response to determining at least some of the additional measurement data fits into any of the plurality of groups, determining at least one group of the plurality of groups in which the additional measurement data belongs; and
based on the determining of the at least one group, generating an indication of the modes of operation of the plurality of loads.

3. The method of claim 1, wherein the modes of operation of the plurality of loads are stored over a second time period.

4. The method of claim 1, wherein the detected pattern of operation of each of the plurality of loads is associated with a duty cycle of the loads, and the duty cycle of the loads is based on power usage of each mode of operation.

5. The method of claim 1, wherein the detected pattern of operation of each of the plurality of loads is associated with a time of actual operation of the loads.

6. The method of claim 2, wherein the generating an indication of the modes of operation of the plurality of loads comprises generating the indication on a monitor.

7. The method of claim 6, further comprising providing the indication to a server.

8. The method of claim 6, further comprising providing the indication to a mobile device.

9. The method of claim 1, wherein the plurality of load monitors measures the measurement data periodically, wherein the periodicity of the measuring changes based on environmental parameters.

10. The method of claim 1, wherein the plurality of load monitors measures the measurement data in response to detected changes in the one or more parameters.

11. The method of claim 1, wherein at least one of the plurality of modes of operation corresponds to an on-state of at least one of the plurality of loads, and at least one of the plurality of modes of operation corresponds to an off-state of the at least one of the plurality of loads.

12. A load monitoring system for a facility, comprising:
a plurality of load monitors configured to monitor one or more parameters of a respective plurality of loads in the facility; and
a processor configured to be coupled to the plurality of load monitors and configured to:
receive measurement data related to the one or more parameters of the plurality of loads over a first, baseline period of time from the plurality of load monitors;
record the measurement data;
determine a plurality of groups indicative of a plurality of modes of operation of the plurality of loads based on the measurement data, each group defining a set of measurements in a continuous range of values, each group having a lower threshold value and an upper threshold value, the lower and upper threshold values defined by having fewer than a minimum threshold number of recorded measurements of the lower and upper threshold values;
store the plurality of modes of operation of the plurality of loads;
determine if additional measurement data fits into any of the plurality of groups;
in response to determining at least some of the additional measurement data does not fit into any of the plurality of groups, generate a count value indicative of a number of the additional measurement data not fitting into any of the plurality of groups;
in response to the count value exceeding a threshold, receive measurement data related to the one or more parameters of the plurality of loads over a new, baseline period of time, and recalibrate the plurality of groups and the stored plurality of modes of operation based on the measurement data received over the new, baseline period of time;
determine a maintenance schedule for each load of the plurality of loads based on the stored plurality of modes of operation and a detected pattern of operation of each of the plurality of loads; and
schedule maintenance of each of the plurality of loads based on the determined maintenance schedule.

13. The load monitoring system of claim 12, the processor further configured to:
in response to determining at least some of the additional measurement data fits into any of the groups, determine at least one group of the plurality of groups in which the additional measurement data belongs; and
based on the determining of the at least one group, generate an indication of the modes of operation of the plurality of loads.

14. The load monitoring system of claim 12, wherein the processor stores the modes of operation of the plurality of loads over a second time period.

15. The load monitoring system of claim 12, wherein the detected pattern of operation of each of the plurality of loads is associated with a duty cycle of the loads, and the duty cycle of the loads is based on power usage of each mode of operation.

16. The load monitoring system of claim 12, wherein the detected pattern of operation of each of the plurality of loads is associated with a time of actual operation of the loads.

17. The load monitoring system of claim 13, further comprising more servers comprising the processor.

18. The load monitoring system of claim 13, wherein the plurality of monitors comprises the processor.

19. The load monitoring system of claim 13, further comprising a mobile device, the processor further configured to provide the indication to the mobile device.

20. A non-transitory computer readable medium having stored thereon sequences of instructions for predicting available run time for a generator including instructions that will cause at least one processor to:
receive measurement data of one or more parameters of the generator over a first, baseline period of time;
record the measurement data;
determine a plurality of groups indicative of a plurality of modes of operation of the generator based on the measurement data, each group defining a set of measurements in a continuous range of values, each group having a lower threshold value and an upper threshold value, the lower and upper threshold values defined by having fewer than a minimum threshold number of recorded measurements of the lower and upper threshold values, wherein at least one of the plurality of modes of operation corresponds to an on-state of the generator, and at least one of the plurality of modes of operation corresponds to an off-state of the generator;
store the plurality of modes of operation of the generator;
receive additional measurement data after the first, baseline period of time;
determine if the additional measurement data fits into any of the plurality of groups;
in response to determining at least some of the additional measurement data does not fit into any of the plurality of groups, generate a count value indicative of a number of the additional measurement data not fitting into any of the plurality of groups;
in response to the count value exceeding a threshold, receive measurement data related to the one or more parameters of the generator over a new, baseline period of time, and recalibrate the plurality of groups and the stored plurality of modes of operation based on the measurement data received over the new, baseline period of time;
determine a maintenance schedule for the generator based on the stored plurality of modes of operation information and a detected pattern of operation of each of the generator; and
schedule maintenance of the generator based on the determined maintenance schedule.

* * * * *